US012628468B2

(12) United States Patent (10) Patent No.: US 12,628,468 B2
Kim et al. (45) Date of Patent: May 12, 2026

(54) METHOD OF MANUFACTURING MICRO-LIGHT EMITTING DIODE AND METHOD OF MANUFACTURING DISPLAY APPARATUS BY USING THE SAME

(71) Applicants:SAMSUNG ELECTRONICS CO., LTD., Suwon-si (KR); SEOUL NATIONAL UNIVERSITY R&DB FOUNDATION, Seoul (KR)

(72) Inventors: Dongho Kim, Suwon-si (KR); Howon Jang, Seoul (KR); Jehong Oh, Uiwang-si (KR); Kyungwook Hwang, Suwon-si (KR); Junsik Hwang, Suwon-si (KR)

(73) Assignees: SAMSUNG ELECTRONICS CO., LTD., Suwon-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 534 days.

(21) Appl. No.: 18/214,808

(22) Filed: Jun. 27, 2023

(65) Prior Publication Data

US 2023/0420604 A1 Dec. 28, 2023

(30) Foreign Application Priority Data

Jun. 27, 2022 (KR) ........................ 10-2022-0078349

(51) Int. Cl.
*H10H 20/01* (2025.01)
*H10H 20/817* (2025.01)
*H10H 20/857* (2025.01)

(52) U.S. Cl.
CPC .... *H10H 20/019* (2025.01); *H10H 20/01335* (2025.01); *H10H 20/817* (2025.01); *H10H 20/857* (2025.01)

(58) Field of Classification Search
CPC .......................... H10H 20/018; H10H 20/019
See application file for complete search history.

(56) References Cited

U.S. PATENT DOCUMENTS

2017/0236807 A1 8/2017 Hwang et al.
2017/0271556 A1* 9/2017 Yoon ................... H10H 20/815
2021/0159361 A1 5/2021 Hwang et al.
2022/0173275 A1 6/2022 Hwang et al.

FOREIGN PATENT DOCUMENTS

CN 107369746 A 11/2017

* cited by examiner

*Primary Examiner* — Zandra V Smith
*Assistant Examiner* — Molly K Reida
(74) *Attorney, Agent, or Firm* — Sughrue Mion, PLLC

(57) ABSTRACT

Provided are a method of manufacturing a micro-LED and a method of manufacturing a display apparatus to which the method is applied. In the method of manufacturing a micro-LED, a membrane formed to include a cavity is formed on a substrate, and then, a sacrificial layer that may be selectively removed by wet etching is formed on the membrane. Next, a light-emitting device is formed on the sacrificial layer, and the light-emitting device is separated from the membrane by the wet etching. In an example, an undoped semiconductor layer may further be formed between the membrane and the sacrificial layer. The sacrificial layer may include an oxide layer having the same crystal lattice structure as that of the undoped semiconductor layer. In an example, another undoped semiconductor layer may further be formed between the sacrificial layer and the light-emitting device.

20 Claims, 20 Drawing Sheets

WET ETCHING

REUSE

METHOD OF MANUFACTURING MICRO-LIGHT EMITTING DIODE AND METHOD OF MANUFACTURING DISPLAY APPARATUS BY USING THE SAME

CROSS-REFERENCE TO RELATED APPLICATION

This application is based on and claims priority under 35 U.S.C. § 119 to Korean Patent Application No. 10-2022-0078349, filed on Jun. 27, 2022, in the Korean Intellectual Property Office, the disclosure of which is incorporated by reference herein in its entirety.

BACKGROUND

1. Field

Example embodiments of the present disclosure relate to light-emitting diode (LED) devices, and more particularly, to methods of manufacturing a LED (such as a micro-LED) and methods of manufacturing a display apparatus including the LED.

2. Description of Related Art

A liquid crystal display (LCD) and an organic light-emitting diode (OLED) display are widely used as display apparatuses. Recently, technology for manufacturing a high-resolution display apparatus using the LED (such as a micro LED) has been in the spotlight. Hereinafter, a micro-LED is discussed as an example of the LED. Various methods of manufacturing a micro-LED have been proposed, and various methods for efficient transfer of the micro-LED are being sought.

SUMMARY

One or more example embodiments provide methods of manufacturing a light-emitting diode (LED) device (e.g., a micro LED device) capable of reducing manufacturing cost or a LED that enables more effective transfer of the LED. One or more example embodiments provide methods of manufacturing a display apparatus that reduces manufacturing cost and time by using the method of manufacturing a LED. Additional aspects will be set forth in part in the description which follows and, in part, will be apparent from the description, or may be learned by practice of the example embodiments of the disclosure.

According to an aspect of an example embodiment, there is provided a method of manufacturing a LED device (e.g., a micro LED device), the method including forming, on a substrate, a membrane (e.g., a nano-membrane) formed to include a cavity, forming a first undoped semiconductor layer on the membrane, and forming a sacrificial layer that may be selectively removed by wet etching on the first undoped semiconductor layer. Next, a light-emitting device may be formed on the sacrificial layer, and the light-emitting device may be separated from the first undoped semiconductor layer by wet etching.

The sacrificial layer may include an oxide layer having the same crystal lattice structure as that of the first undoped semiconductor layer.

A second undoped semiconductor layer may further be formed between the sacrificial layer and the light-emitting device.

The light-emitting device may be directly formed on the sacrificial layer.

A plurality of membranes may be formed on the substrate, and the first undoped semiconductor layer may be formed on the plurality of membranes. The forming of the first undoped semiconductor layer on the plurality of membrane may include forming, on each of the plurality of membranes, first material layers to be the first undoped semiconductor layer, and coalescing the first material layers with each other by growing the first material layers in a lateral direction.

The sacrificial layer may include a material having a hexagonal wurtzite lattice structure. The sacrificial layer may include ZnO. HCl, NH$_4$Cl or H$_3$PO$_3$ may be used as the etching solution in the wet etching. A surface roughness of the surface separated from the sacrificial layer of the separated light-emitting device may be in a range from about 1.5 nm to about 2.5 nm.

The step of forming of the membrane including a cavity on the substrate may include forming a sacrificial layer pattern on the substrate, forming a membrane material layer covering the sacrificial layer pattern on the substrate, forming the cavity by removing the sacrificial layer pattern, and crystallizing the membrane material layer.

The step of forming of a light-emitting device on the sacrificial layer may include forming a first semiconductor layer on the sacrificial layer, forming an active layer on a partial region of one surface of the first semiconductor layer, forming a second semiconductor layer on the active layer, and forming a first electrode connected to the first semiconductor layer and a second electrode connected to the second semiconductor layer. Both of the first and second electrodes may be formed on one side of the first semiconductor layer, which is opposite to the sacrificial layer.

According to another aspect of an example embodiment, there is provided a method of manufacturing a display apparatus, the method including forming a LED by using a method of manufacturing a LED according to an embodiment, and transferring the formed LED to a pixel region of a display panel.

The LED may be transferred by using a fluid self-assembly method. The fluid self-assembly method may include stirring the formed LED with a liquid, dropping the liquid including the LED into grooves of a transfer substrate having a plurality of grooves formed in a surface thereof, and arranging the LED dropped into the grooves.

According to yet another aspect of an example embodiment, there is provided a structure including a LED, the structure includes a substrate on which a membrane including a cavity is formed, an undoped semiconductor layer formed on the membrane, a sacrificial layer formed on the undoped semiconductor layer, and a light-emitting device layer formed on the sacrificial layer, wherein the light-emitting device layer includes a first semiconductor layer, an active layer formed on the first semiconductor layer, a second semiconductor layer formed on the active layer, a first electrode layer connected to the first semiconductor layer, and a second electrode layer connected to the second semiconductor layer. Both of the first and second electrodes may be formed on one side of the first semiconductor layer, which is opposite to the sacrificial layer.

BRIEF DESCRIPTION OF THE DRAWINGS

The above and/or other aspects, features, and advantages of certain example embodiments of the disclosure will be more apparent from the following description taken in conjunction with the accompanying drawings, in which.

DETAILED DESCRIPTION

Figure 1:
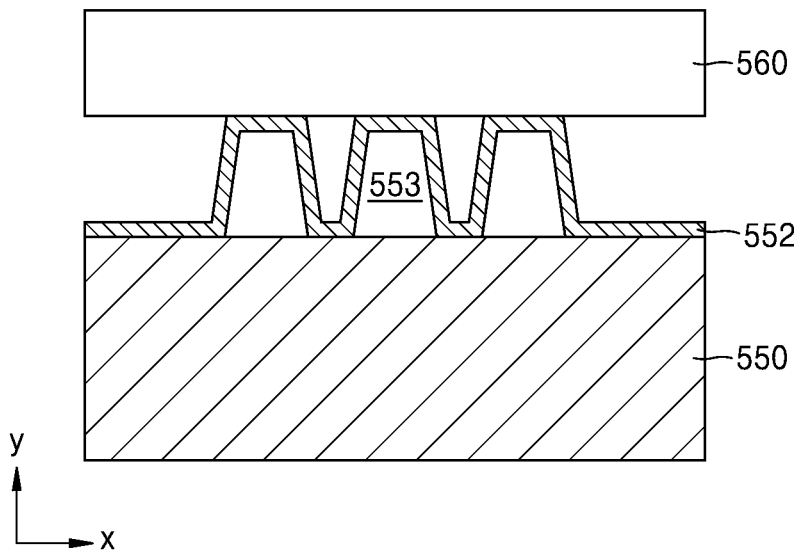
FIGS. 1 to 3 are cross-sectional views showing a first manufacturing method of manufacturing a micro light-emitting diode (LED) device, according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a method of manufacturing a micro-LED and a method of manufacturing a display apparatus to which the method is applied according to example embodiments will be described in detail with reference to the accompanying drawings. In the drawings, thicknesses of layers and regions may be exaggerated for clarification of the specification.

The following example embodiments described below are merely illustrative, and various modifications may be possible from the embodiments of the present disclosure. It will be understood that when an element or layer is referred to as being "on" or "above" another element or layer, the element or layer may be directly on another element or layer or intervening elements or layers. In the drawings, like reference numerals are used to like elements.

In the following example embodiments, the singular forms include the plural forms unless the context clearly indicates otherwise. When a part "comprises" or "includes" an element in the specification, unless otherwise defined, it is not excluding other elements but may further include other elements.

In the specification, the term "above" and similar directional terms may be applied to both singular and plural. With respect to operations that constitute a method, the operations may be performed in any appropriate sequence unless the sequence of operations is clearly described or unless the context clearly indicates otherwise. The operations may not necessarily be performed in the order of sequence.

Also, in the specification, the term "units" or " . . . modules" denote units or modules that process at least one function or operation, and may be realized by hardware, software, or a combination of hardware and software. Connections or connection members of lines between components shown in the drawings illustrate functional connections and/or physical or circuit connections, and the connections or connection members can be represented by replaceable or additional various functional connections, physical connections, or circuit connections in an actual apparatus.

All examples or example terms are simply used to explain in detail the technical scope of example embodiments, and thus, the scope of the disclosure is not limited by the examples or the example terms.

Figure 2:
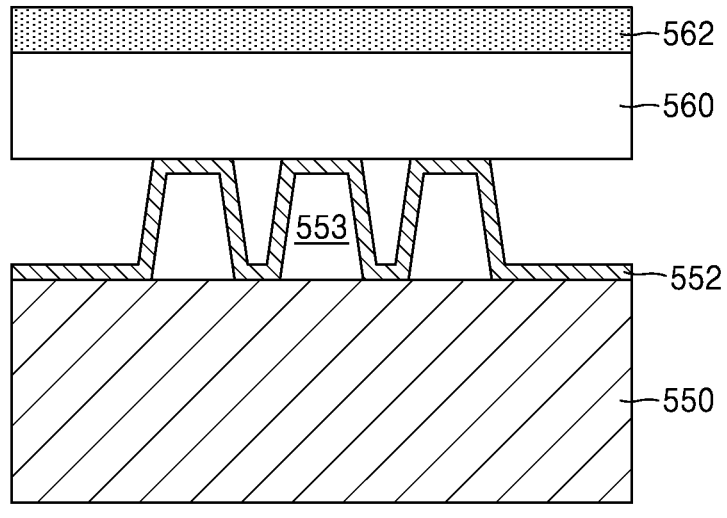
Figure 3:
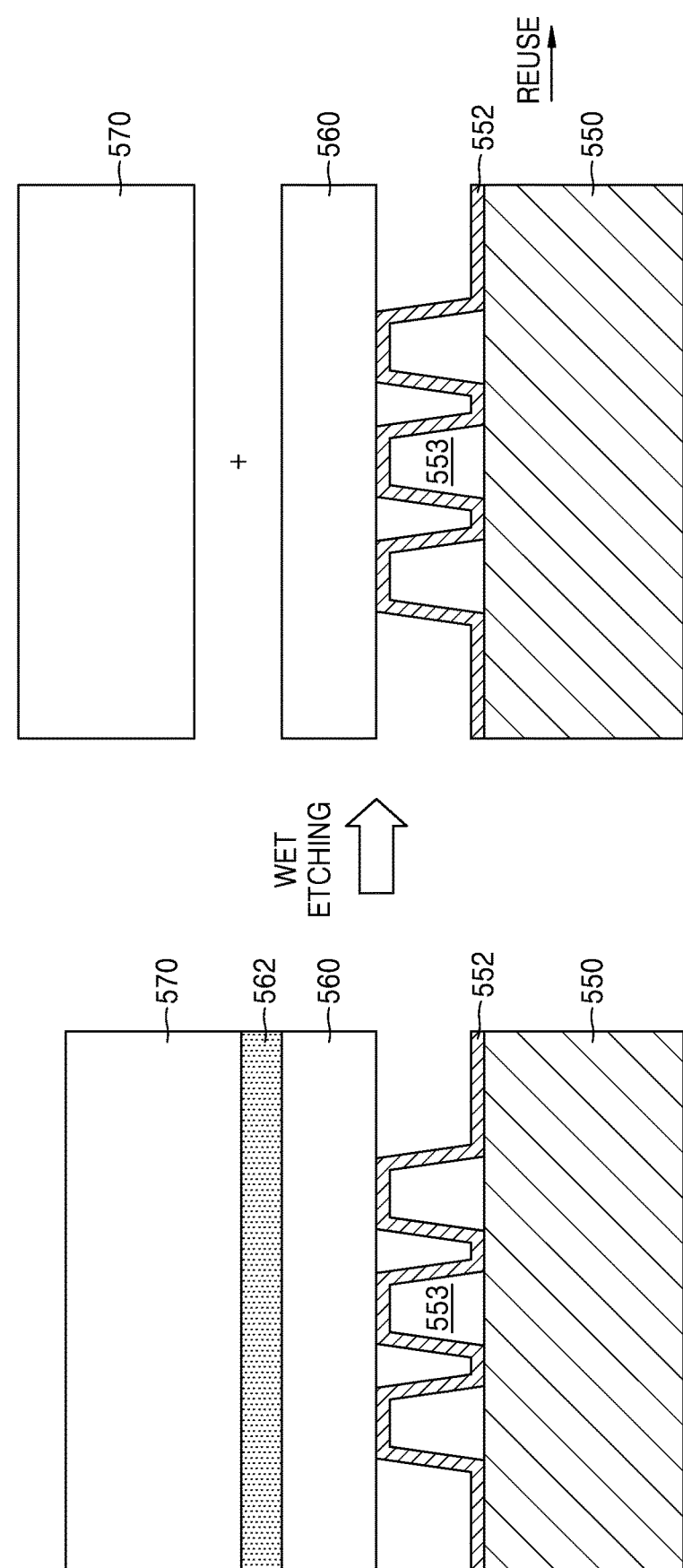

First, a method of manufacturing a micro-LED, according to an example embodiment, is described. FIGS. 1 to 3 show a method of manufacturing a micro-LED (hereinafter, a first manufacturing method), according to an example embodiment.

Referring to FIG. 1, a plurality of membranes 552 are formed on one surface of a substrate 550. Each of the plurality of membranes 552 may be a nano-membrane having dimensions (thickness, width, etc.) of a nanometer level. For example, each of the plurality of membranes 552 may have a thickness of 300 nm or less, 200 nm or less, in a range from about 50 nm to about 150 nm, or about 100 nm. A process of forming the plurality of membranes 552 on the substrate 550 is described below.

The substrate 550 may have an upper surface, a lower surface, a side surface, or an inclined surface depending on the viewpoint from which the substrate 550 is viewed. In the description, for convenience, the substrate 550 is regarded as having an upper surface. As shown in FIG. 1, the plurality of membranes 552 are formed in a direction perpendicular to the upper surface of the substrate 550 and include convex portions having substantially the same height. In FIG. 1, although membranes 552 are illustrated as including three convex portions, the plurality of membranes 552 may include more or less than three convex portions. In an example embodiment, the plurality of membranes 552 may be a single membrane including only one convex portion.

The convex portions of the plurality of membranes 552 are arranged in a first direction (e.g., an x-axis direction) parallel to the upper surface of the substrate 550, and each convex portion has a flat portion having an upper surface. The flat portion having the upper surfaces of the convex portions may be substantially parallel to the upper surface of the substrate 550. Portions (the flat portion and sidewalls having side surfaces) except for lower ends of the convex portion are separated from each other in the first direction, but the convex portions are connected to each other through the lower ends. The lower ends of the convex portions are in direct contact with the upper surface of the substrate 550. A portion of each of the convex portions other than the lower end may be separated from the upper surface of the substrate 550.

Each of the convex portions of the plurality of membranes 552 may include a cavity 553. The flat portion of the convex portion may be a structure (or layer) defining a region of the cavity 553 in a direction perpendicular to the upper surface of the substrate 550 (e.g., a y-axis direction in FIG. 1). The sidewall including the side surface of the convex portion may be a structure defining a region of the cavity 553 in the lateral direction, that is, in the first direction. For example, the region of the cavity 553 may be defined by a flat portion and sidewalls of the convex portion. The flat portion of the convex portion and the upper surface of the substrate 550 may face each other with the cavity 553 there between, and may be parallel to each other. Each of the convex portions of the plurality of membranes 552 on the upper surface of the substrate 550 may be formed to be symmetrical or substantially symmetrical. Accordingly, the cavity 553, which is an empty space inside the convex portion, may also be symmetrical or substantially symmetrical.

The plurality of membranes 552 may be formed through a crystallization process and may be formed in a polycrystalline form or a single crystal form including large particles. The plurality of membranes 552 may be alumina ($Al_2O_3$) or may include alumina, but are not limited thereto.

In an example embodiment, the substrate 550 may include a sapphire substrate, but is not limited thereto, and may vary depending on the material of a light-emitting layer (LEL) of the micro-LED. Subsequently, a semiconductor layer 560, which is an undoped layer, is formed on the plurality of membranes 552. The semiconductor layer 560 is formed on upper surfaces of the plurality of membranes 552 and covers the entire upper surfaces thereof. The semiconductor layer 560 is formed directly on the upper surfaces of the plurality of membranes 552. In an example embodiment, after forming a material layer to be the semiconductor layer 560 on each of the membranes 552, the semiconductor layer 560 may be formed by epitaxial growing the material layers so that the material layers coalesce with each other in a lateral direction, but the method is not limited thereto.

In an example embodiment, the semiconductor layer 560 may include a compound semiconductor. In an example embodiment, the compound semiconductor may include a nitride semiconductor, but is not limited thereto. In an example embodiment, the compound semiconductor may include a Group 111-V compound semiconductor, for example, may include GaN. In an example embodiment, the semiconductor layer 560 that is an undoped layer may be formed to a first thickness. The first thickness thereof may be in a range from about 1 μm to about 5 μm.

Next, as shown in FIG. 2, a sacrificial layer 562 (for separation) is formed on the semiconductor layer 560. The sacrificial layer 562 (for separation) may be expressed as a 'separation sacrificial layer,' or may be expressed as a 'separation layer' configured to separate two layers considering their roles. The sacrificial layer 562 is a layer used to separate a formed LED from the semiconductor layer 560 after the LED is formed on the sacrificial layer 562. In an example embodiment, the sacrificial layer 562 may be selectively removed in a wet removal process, and may include a material layer having the same or substantially the same lattice structure as a crystal lattice structure of the semiconductor layer 560. For example, when the semiconductor layer 560 includes GaN having a hexagonal Wurtzite lattice structure, the sacrificial layer 562 may include ZnO. In an example embodiment, the sacrificial layer 562 may be formed by using a pulsed laser deposition (PLD) method, an atomic layer deposition (ALD) method, a molecular beam epitaxy (MBE) method, or the like.

Next, as shown in FIG. 3, a micro-LED 570 is formed on the sacrificial layer 562. In an example embodiment, the micro-LED 570 may include a nitride-based LED. In an example embodiment, nitride of the nitride-based LED may include gallium nitride. The method of manufacturing the micro-LED 570 is described below.

After the micro-LED 570 is formed, a resultant product on which the micro-LED 570 is formed. That is, the substrate 550 (on which the micro-LED 570 is formed) is wet-etched. In an example embodiment, the substrate 550 (on which the micro-LED 570 is formed) is placed in an etching solution for a given time. At this time, the substrate 550 and the stack formed thereon are completely immersed in the etching solution. The wet etching may be performed until the sacrificial layer 562 is completely removed in the etching solution. As the sacrificial layer 562 is completely removed by the wet etching, the micro-LED 570 and the semiconductor layer 560 are separated from each other. For example, as a result of the wet etching, the resultant product (in which the micro-LED 570 of FIG. 3 is formed) is separated into the micro-LED 570 and remaining portions (the substrate 550, the plurality of membranes 552, and the semiconductor layer 560), as shown on the right side of FIG. 3.

In an example embodiment, the etching solution may be an etching solution capable of selectively etching the sacrificial layer 562, for example, a hydrochloric acid (HCl) solution, a phosphorous acid ($H_3PO_3$) solution, or a chloride ammonium ($NH_4Cl$) solution capable of selectively etching ZnO.

The micro-LED 570 separated by the wet etching may be transferred to a set region of a display apparatus (e.g., an LED display) by a transfer process after undergone washing and drying processes. Because the sacrificial layer 562 is completely removed from the lower surface of the micro-LED 570 by the wet etching (a surface directly contacting the sacrificial layer 562 before the wet etching), a surface roughness of the lower surface of the micro-LED 570 is lowered to about 1.5 nm to 2.5 nm, for example, 2 nm or less, and thus, the lower surface of the micro-LED 570 may have a substantially smooth surface. On the other hand, on the upper surface of the micro-LED 570, that is, a surface opposite to the lower surface thereof, electrodes are formed, and thus, a friction force is relatively greater than that of the lower surface of the micro-LED 570.

As such, because there is a frictional force difference between the two opposing surfaces of the micro-LED 570, the transfer of the micro-LED 570 may proceed using a fluidic self-assembly (FSA) process for arranging micro LEDs using a fluid.

In the FSA process, the micro-LED 570, which is separated first, for example, from the substrate 550 by the method described above, is put into a liquid and stirred. The stirring proceeds so that the micro-LED 570 is evenly distributed over an entire region of the liquid, and the stirring may be maintained until the transfer of the micro-LED 570 is completed for even distribution of the micro-LED 570 in the liquid. Next, a liquid (hereinafter, an LED liquid) including the micro-LED 570 is supplied (transferred) to grooves of a transfer substrate having a plurality of grooves formed in a surface thereof, and then the micro-LED 570 supplied to the grooves is arranged. In an example embodiment, the method of supplying the LED liquid to the grooves formed in the transfer substrate includes a method of dropping the LED liquid in the form of drops into the grooves or a method of spraying the LED liquid onto a surface of the transfer substrate in which the grooves are formed. In an example embodiment, the process of arranging the micro-LED 570 supplied to the grooves in a surface of the transfer substrate may include a process of arranging the micro-LED 570 so that light-emitting surfaces of the micro-LEDs 570 supplied to the grooves are in the same direction, and for this process, the LED liquid supplied to the grooves may appropriately flow in the grooves. The grooves formed in the surface of the transfer substrate may correspond to a pixel region in which the micro-LED 570 of an LED display is disposed.

When following the first manufacturing method described above, more effective LED transfer may be achieved, and transfer efficiency may be increased. In addition, because the FSA process is applied to the manufacturing of an LED display apparatus, a manufacturing time of an LED display may be reduced. The advantages may also be advantages of the manufacturing method described below.

In the remaining portions (the substrate 550, the plurality of membranes 552, and the semiconductor layer 560) separated by the wet etching, the sacrificial layer 562 is selectively and completely removed from the semiconductor layer 560 that is an undoped layer, and the remaining portions (the substrate 550, the plurality of membranes 552, and the semiconductor layer 560) may be reused in the manufacture of LEDs. Accordingly, the manufacturing cost of the micro-LED 570 may be lowered.

Next, a method of manufacturing a micro-LED 570, according to an example embodiment (hereinafter, a second manufacturing method), is described with reference to FIGS. 4 to 7. Only parts different from the first manufacturing method (described above) are described.

Figure 4:
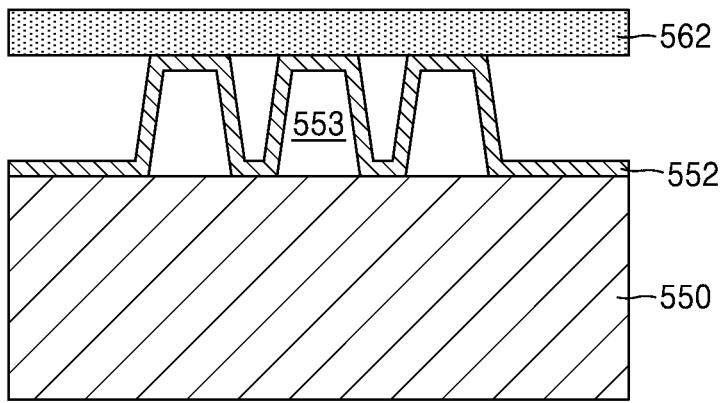
FIGS. 4 to 7 are cross-sectional views illustrating a second manufacturing method of manufacturing a micro-LED according to an example embodiment.

First, as shown in FIG. 4, a sacrificial layer 562 is formed on a plurality of membranes 552. The sacrificial layer 562 may be formed such that, after first material layers to be sacrificial layers are respectively formed on the plurality of membranes 552, the first material layers are laterally grown so that the first material layers coalesce with each other.

Figure 5:
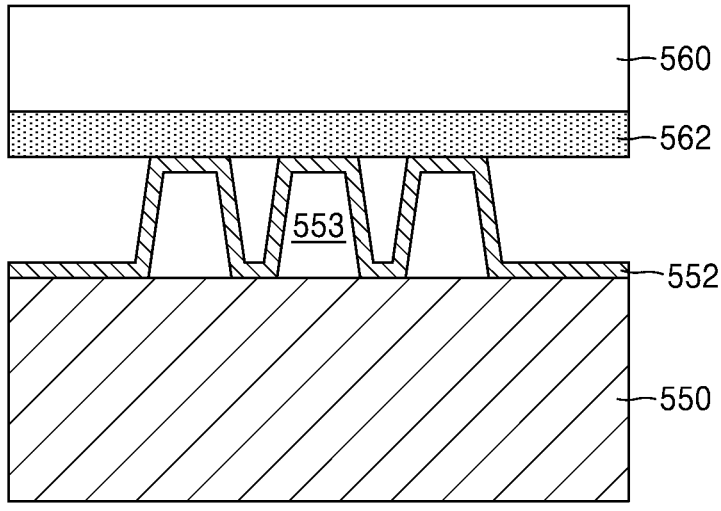

Next, as shown in FIG. 5, a semiconductor layer 560, which is an undoped layer, is formed on the sacrificial layer 562.

Figure 6:
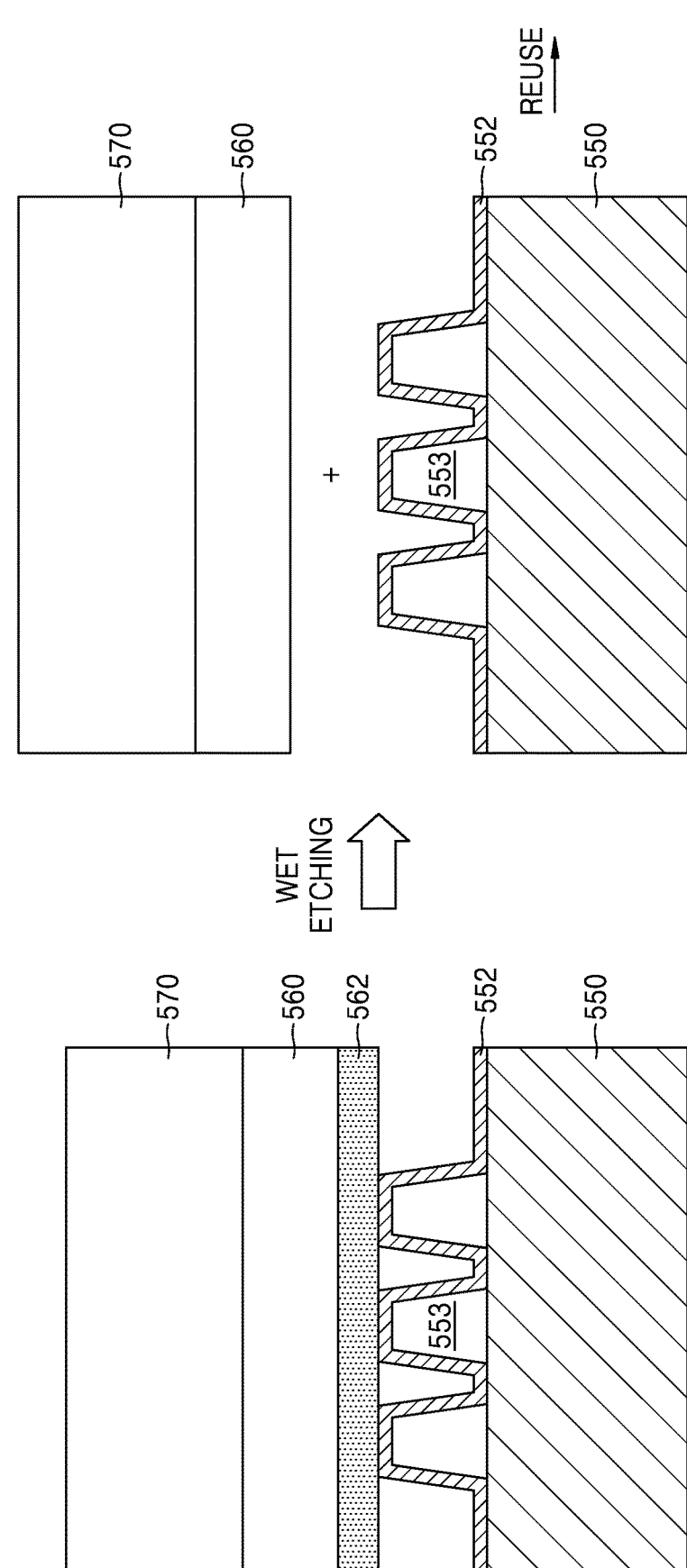

Next, as shown in FIG. 6, a micro-LED 570 is formed on the semiconductor layer 560. Note that, in FIG. 3, the micro-LED 570 is formed on the sacrificial layer 562. In FIG. 6, the semiconductor layer 560 and the micro-LED 570 are separated from remaining portions (the substrate 550 and the plurality of membranes 552) by wet etching a resultant product in which the micro-LED 570 is formed. The process and conditions of the wet etching may be the same as those of the wet etching described in the first manufacturing method.

The separated micro-LED 570 may be transferred to a set region of a display apparatus. Because the sacrificial layer 562 is completely removed from a lower surface of the semiconductor layer 560 (a surface in direct contact with the sacrificial layer 562) by the wet etching, a surface roughness of the lower surface of the semiconductor layer 560 is reduced to about 2 nm, and the lower surface of the semiconductor layer 560 becomes a substantially smooth surface.

On the other hand, because electrodes are on a surface opposite to the lower surface of the semiconductor layer 560, the surface of the semiconductor layer 560 may have a greater frictional force than the lower surface of the semiconductor layer 560. Due to the difference in frictional force, the transfer of the micro-LED 570 may be performed using the FSA process. In addition, because the sacrificial layer 562 may be completely removed from the remaining portions (the substrate 550 and the plurality of membranes 552) without damaging the plurality of membranes 552 by the selective etching of the wet etching, the substrate 550 and the plurality of membranes 552 may be reused for manufacturing an LED, and accordingly, the manufacturing cost of the micro-LED 570 may be reduced.

Figure 7:
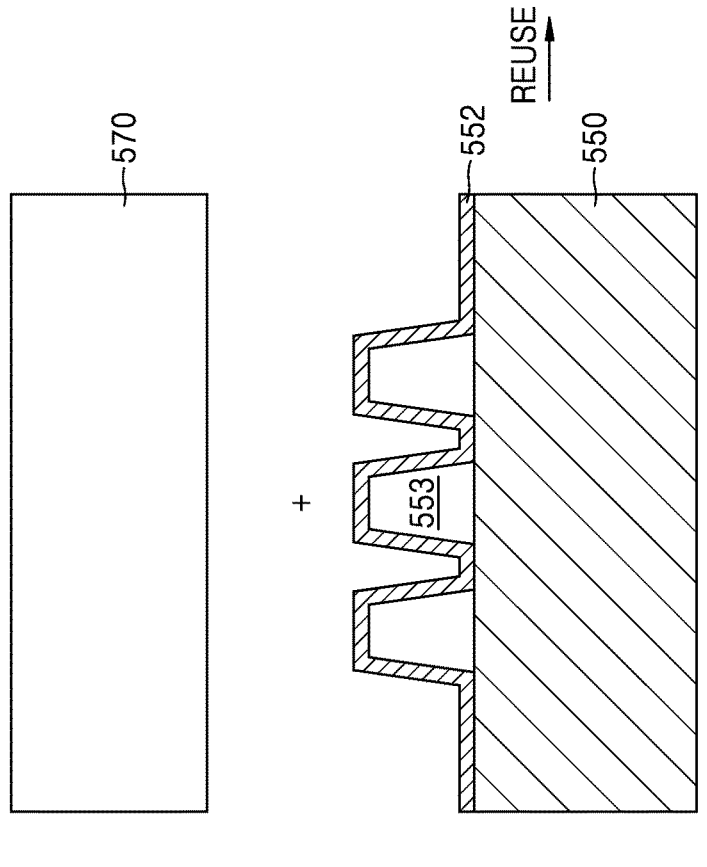
Figure 7:
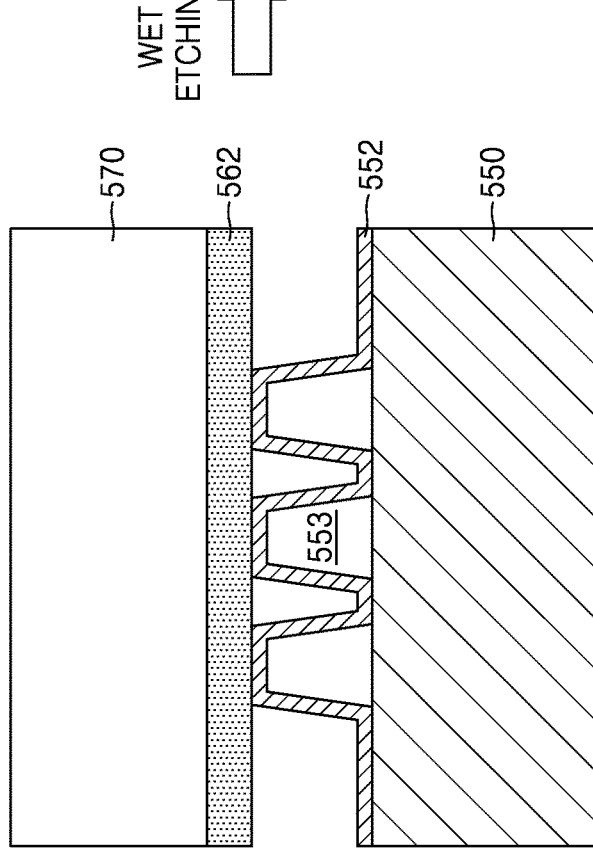

Although the semiconductor layer 560 (the undoped layer) and the micro-LED 570 are sequentially stacked on the sacrificial layer 562 in the second manufacturing method, the semiconductor layer 560 (the undoped layer) may be omitted. For example, as shown in FIG. 7, the micro-LED 570 may be directly formed on the sacrificial layer 562, and the subsequent process may be the same.

Alternatively, the first and second manufacturing methods may be combined with one another. For example, after forming a first undoped semiconductor layer between the sacrificial layer 562 and the nano-membrane 552 according to the first manufacturing method, then, a second undoped semiconductor layer may be formed between the sacrificial layer 562 and the micro-LED 570 according to the second manufacturing method, and the micro-LED 570 may be formed as a light-emitting device layer on the second undoped semiconductor layer.

FIGS. 8A to 8D show an example of the micro-LED 570 described in the first and second manufacturing methods described above.

Figure 8A:
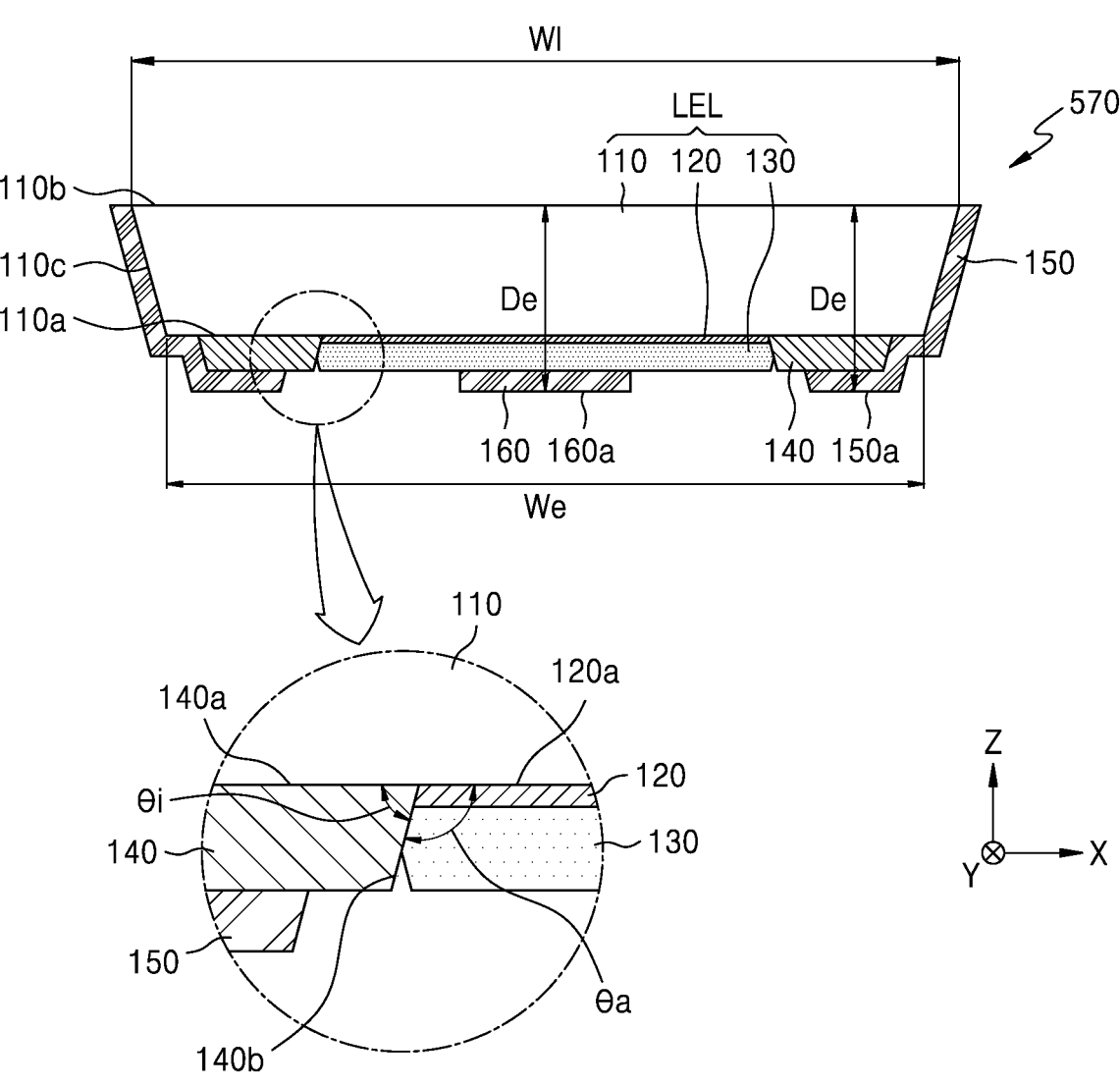
FIGS. 8A to 8D show an example of the micro-LED 570 described in the first and second manufacturing methods.
Figure 8B:
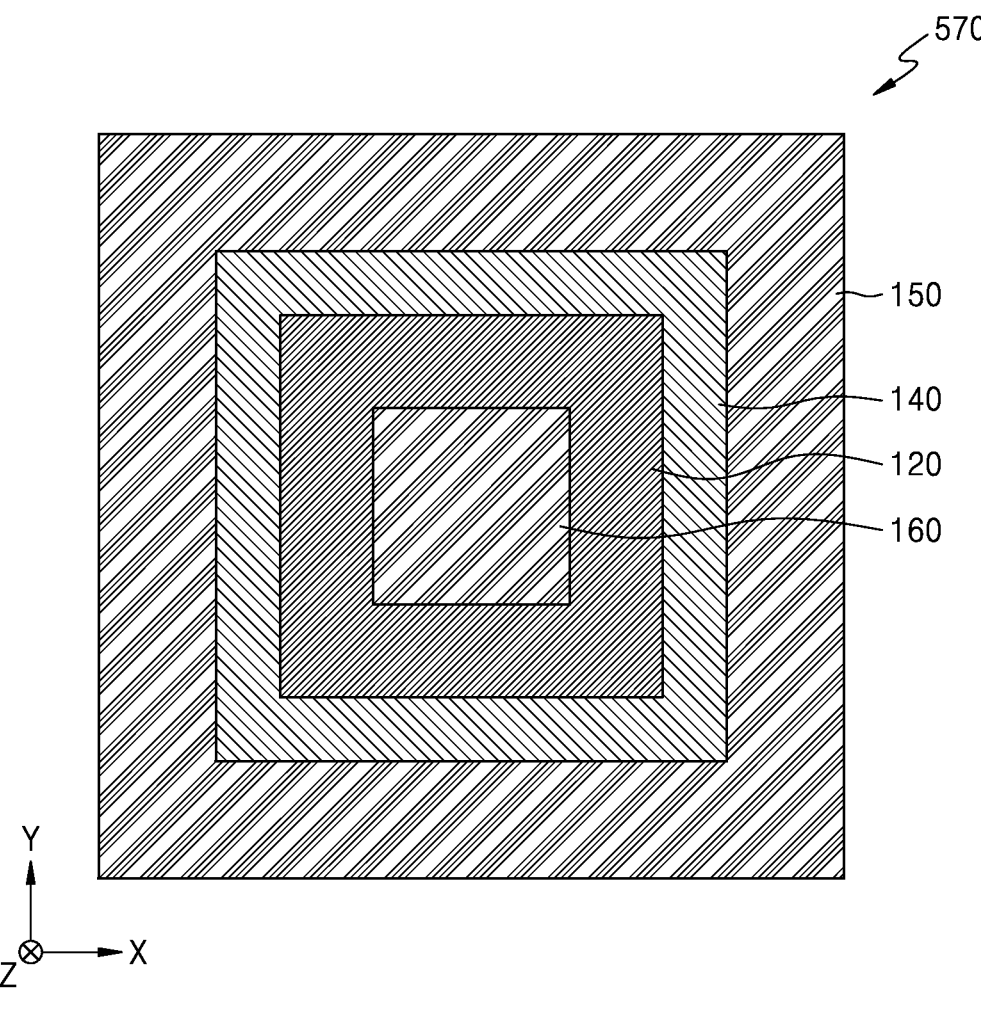
Figure 8C:
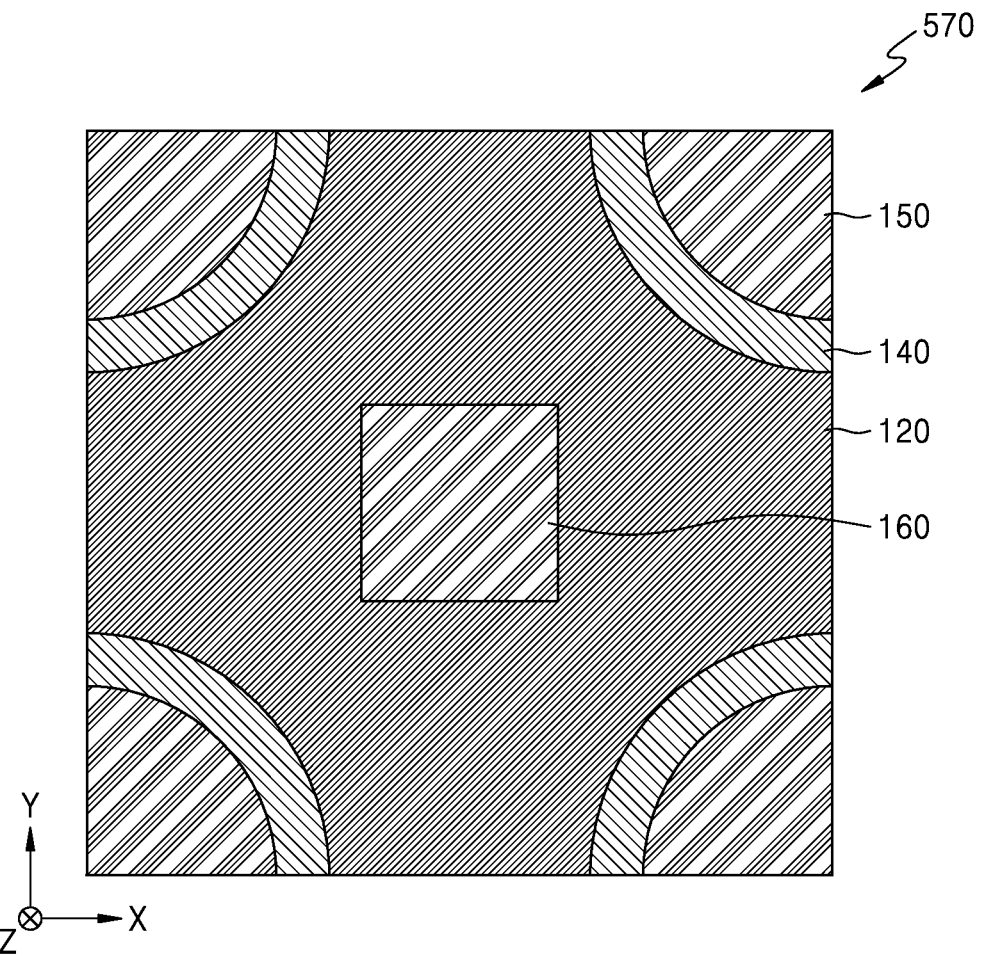
Figure 8D:
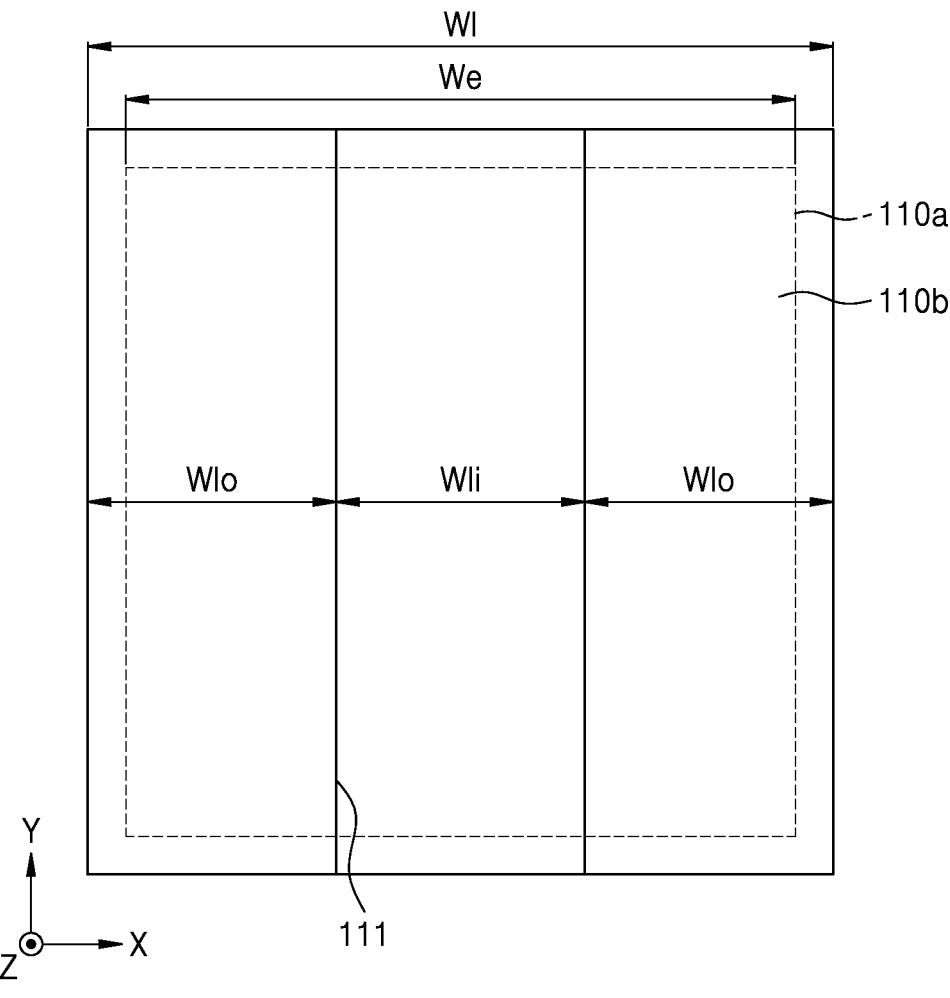

FIG. 8A is a cross-sectional view of the micro-LED 570 according to an embodiment, FIG. 8B is an example of a plan view of the micro-LED 570 of FIG. 8A from an electrode formation surface side, FIG. 8C is another example of a plan view of the micro-LED 570 of FIG. 8A from the electrode formation surface side, and FIG. 8D is a plan view of a light emission surface of a first semiconductor layer of FIG. 8A.

Referring to FIG. 8A, the micro-LED 570 has a horizontal electrode structure. Specifically, the micro-LED 570 includes a LEL and first and second electrodes 150 and 160 provided on sides of the LEL. For example, the LEL may be an inorganic material-based light-emitting diode layer.

The LEL may include a first semiconductor layer 110, an active layer 120, and a second semiconductor layer 130. The first semiconductor layer 110 may have a three-dimensional shape having a relatively large thickness, compared to the active layer 120 and the second semiconductor layer 130.

Specifically, the first semiconductor layer 110 may include an electrode formation surface 110a having a first width 'We' and a light emission surface 110b having a second width 'WI,' wherein the second width 'WI' is greater than the first width 'We,' and an area of the electrode formation surface 110a may be less than an area of the light emission surface 110b. The electrode formation surface 110a may be a surface in a direction in which the first and second electrodes 150 and 160 are formed, and the light emission surface 110b may be a surface in a direction in which light generated by the LEL is emitted to the outside.

The first semiconductor layer 110 may be an n-type semiconductor or a p-type semiconductor. Here, a case of an n-type semiconductor is described as an example. The first semiconductor layer 110 may include a Group III-V based n-type semiconductor, for example, an n-type nitride semiconductor. The nitride semiconductor may include, for example, GaN, InN, AlN, or a combination thereof, and for example, the first semiconductor layer 110 may include n-GaN. The first semiconductor layer 110 may have a single-layer or multi-layer structure.

The active layer 120 and the second semiconductor layer 130 may have a relatively small thickness compared to the first semiconductor layer 110. The active layer 120 may be provided to cover all or a part of the electrode formation surface 110a of the first semiconductor layer 110 having a three-dimensional shape, and besides the electrode formation surface 110a, the active layer 120 may be provided to cover all or a part of the side surface 110c and a part of the light emission surface 110b.

The active layer 120 may have a multi-quantum well (MQW) or single-quantum well (SQW) structure, and may generate light by combining electrons with holes. The active layer 120 may include a Group III-V series semiconductor, for example, a nitride semiconductor. For example, the active layer 120 may include GaN.

The second semiconductor layer 130 may be provided to cover the active layer 120. The second semiconductor layer 130 may be a semiconductor layer doped with a dopant of a different type from that of the first semiconductor layer 110. In an example embodiment, the second semiconductor layer 130 may include a Group III-V series p-type semiconductor, for example, a p-type nitride semiconductor. In an example embodiment, the second semiconductor layer 130 may include p-GaN. The second semiconductor layer 130 may have a single-layer or multi-layer structure.

An insulating layer 140 may be formed to cover a part of the electrode formation surface 110a of the first semiconductor layer 110, the insulating layer 140 may extend and cover a part or all of the side surface 110c. The insulating layer 140 may form an open region where the active layer 120 and the second semiconductor layer 130 are not formed on the electrode formation surface 110a and/or the side surface 110c of the first semiconductor layer 110. In other words, the open region may be a region in which a first electrode 150 contacts the first semiconductor layer 110. The insulating layer 140 may also be disposed between the first electrode 150 and the second semiconductor layer 130 so that the first electrode 150 does not electrically contact the second semiconductor layer 130.

The insulating layer 140 may include an anti-growth material, for example, $SiO_2$ or SiN, to inhibit the growth of the active layer 120 and the second semiconductor layer 130.

Referring to the partially enlarged view of FIG. 8A, an angle 'θi' formed between a surface 140a of the insulating layer 140 in contact with the first semiconductor layer 110, that is, a portion in contact with the insulating layer in the electrode formation surface 110a, and a surface 140b of the insulating layer 140 in contact with the active layer 120 and the second semiconductor layer 130 may be less than 90°.

In addition, an angle 'θa' is formed between the insulating layer 140 and a surface 120a of the active layer 120 in contact with the first semiconductor layer 110. That is, the angle 'θa' is an angle between (i) a portion of the electrode formation surface 110a in contact with the active layer 120 and (ii) the surface 140b of the insulating layer 140 in contact with the active layer 120 and the second semiconductor layer 130. The angle 'θa' may be greater than 90°.

The insulating layer 140 of FIG. 8A is not formed in a region from which a part of the active layer 120 and the second semiconductor layer 130 is removed by etching, but is formed before forming the active layer 120 and the second semiconductor layer 130, and thus, a contact structure described above may be formed.

The first electrode 150 is provided to be electrically connected to the first semiconductor layer 110. Specifically, the first electrode 150 may be in contact with a part of the electrode-forming surface 110a and/or the side surface 110c of the first semiconductor layer 110 through an open region in which the insulating layer 140 is not provided. The first electrode 150 may include an extension unit extending over the insulating layer 140.

A second electrode 160 is provided to be electrically connected to the second semiconductor layer 130. Specifically, the second electrode 160 may be disposed on the second semiconductor layer 130.

The first electrode 150 and the second electrode 160 may be reflective electrodes, and may include a metal material having high conductivity. The first electrode 150 may be an n-type electrode, and the second electrode 160 may be a p-type electrode. The first and second electrodes 150 and 160 may have the same horizontal electrode structure on which the electrode is provided, and driving unit connection surfaces 150a and 160a of the first and second electrodes 150 and 160 may be formed at the same distance De with respect to the light emission surface 110b. The driving unit connection surfaces 150a and 160a may represent surfaces where a driving unit for driving the micro-LED 570 is connected to the first and second electrodes 150 and 160.

Referring to FIG. 8B, the first electrode 150 may be disposed in a region surrounding an edge of the micro-LED 570, and the second electrode 160 may be disposed at the center of the micro-LED 570. However, the electrode arrangement in FIG. 8B is only an example, and as shown in FIG. 8C, the first electrode 150 may be arranged in various positions, such as in four corner regions of the micro-LED 570.

Referring to FIG. 8D, the micro-LED 570 may include one or a plurality of defect lines 111 formed on the light emission surface 110b of the first semiconductor layer 110. The defect lines 111 may be generated by a defect that occurs when a plurality of semiconductors grown separately at different locations meet and combine into a single mass. In the vicinity of the defect lines 111, the amount of defects, for example, dislocations, may be greater than at other positions. The defect lines 111 may also be displayed in a darker color than other regions.

The defect lines 111 may be arranged in a direction parallel to one side of the light emission surface 110b, and when two or more defect lines 111 are included, a gap Wli between the defect line 111 and the defect line 111 may be less than a gap Wlo between the defect line 111 and one side of the light emission surface 110b.

When a voltage is applied to the first and second electrodes 150 and 160, respectively, in the micro-LED 570 having the structure described above, in the active layer 120 of the light emitting layer (LEL), electrons and holes combined and generate light having a predetermined wavelength band and emitted to the outside of the micro-LED 570. The micro-LED 570 may emit light of a desired wavelength band by appropriately selecting a material and/or structure constituting the LEL and adjusting a band gap. For example, the micro-LED 570 may be applied as a pixel to a display apparatus and configured to emit red light, green light, or blue light.

The micro-LED 570 may include a micro-sized LED. Specifically, the micro-LED 570 may have a size of, for example, about 100 μm×100 μm or less, and may have a thickness of about 10 μm or less.

Figure 9:
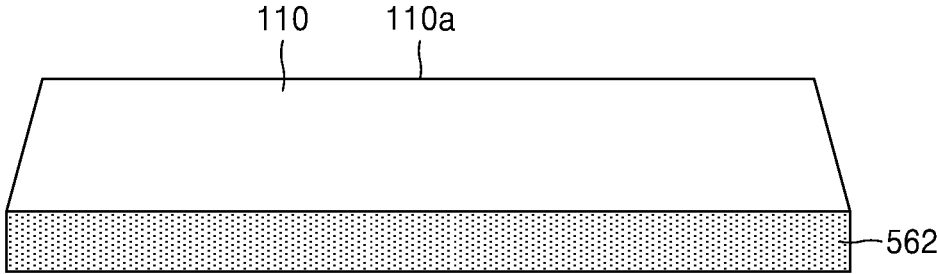
FIGS. 9 to 13 illustrate methods of manufacturing the micro-LED illustrated in FIGS. 8A to 8D in stages.

FIGS. 9 to 13 show a method of manufacturing the micro-LED 570 illustrated in FIGS. 8A to 8D. Referring to FIG. 9, the first semiconductor layer 110, in which the electrode formation surface 110a is planarized, is formed on the sacrificial layer 562.

Figure 10:
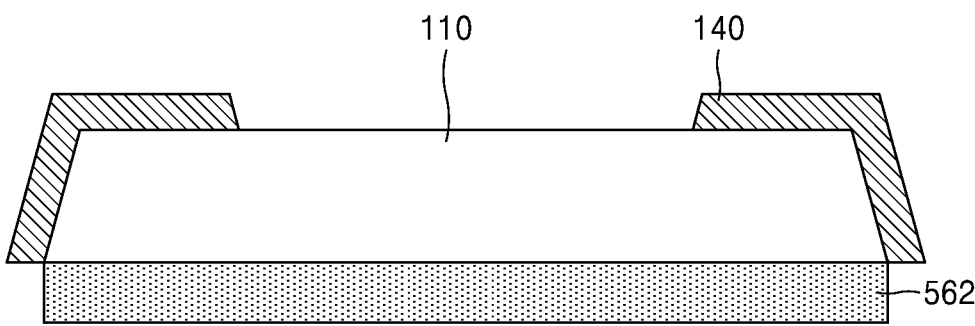

Referring to FIG. 10, the insulating layer 140 is formed on a partial region of an upper surface of the first semiconductor layer 110. The insulating layer 140 may be formed in a larger region than the first electrode 150 considering the position and size of the first electrode 150 in contact with the first semiconductor layer 110. The insulating layer 140 may be a material that inhibits growth of the active layer 120 and the second semiconductor layer 130 in a subsequent process, and may include, for example, $SiO_2$ or SiN.

Figure 11:
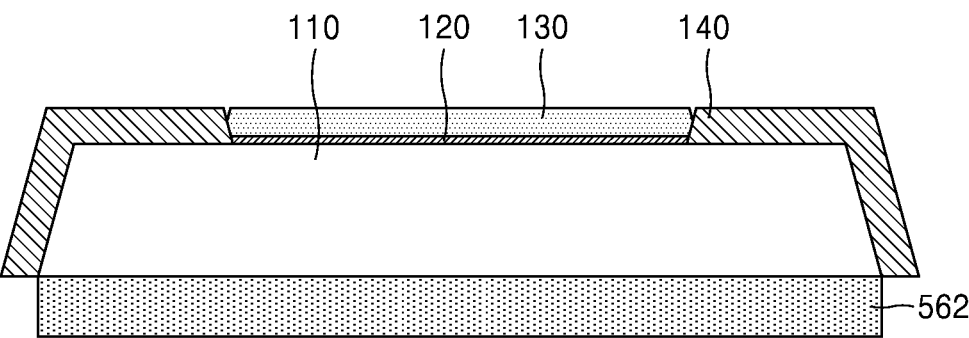

Referring to FIG. 11, the active layer 120 and the second semiconductor layer 130 are grown on the first semiconductor layer 110, on which the insulating layer 140 is not formed. In an example embodiment, the active layer 120 and the second semiconductor layer 130 may be grown by using a chemical vapor deposition (CVD) method. In an example embodiment, the active layer 120 and the second semiconductor layer 130 may include a nitride semiconductor, for example, GaN, InN, AlN, or a combination thereof.

Figure 12:
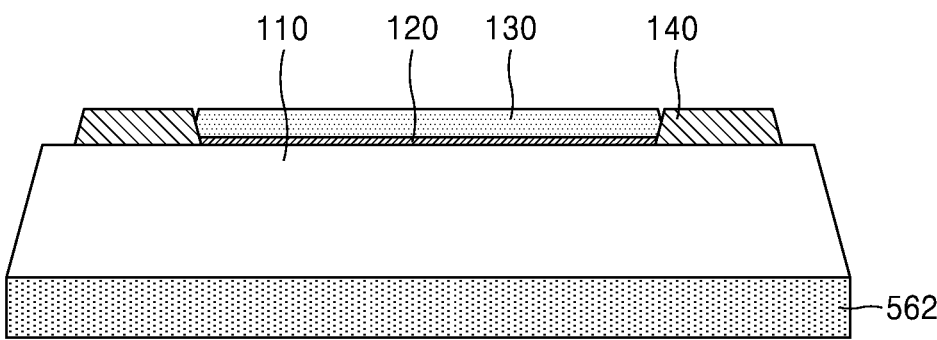

Referring to FIG. 12, the insulating layer 140 formed on the portion of the first semiconductor layer 110, where the first electrode 150 is to be formed, is removed. A desired portion of the insulating layer 140 may be removed through a photo process.

Figure 13:
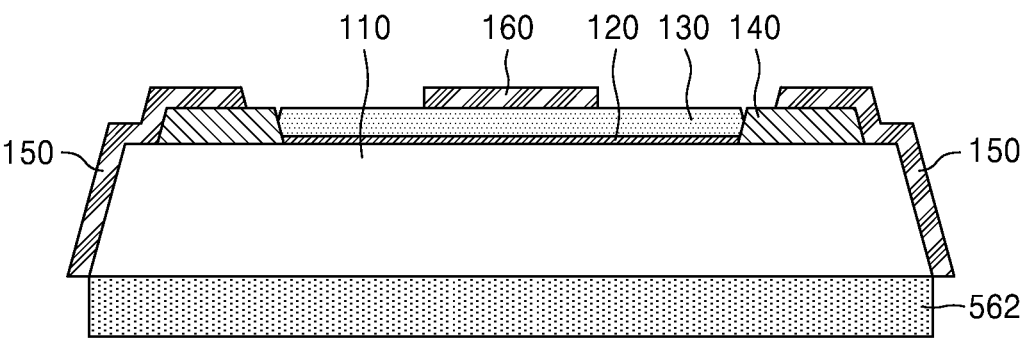

Referring to FIG. 13, the first electrode 150 may be formed in an exposed portion of the first semiconductor layer 110, and the second electrode 160 may be formed in a partial region of the second semiconductor layer 130. After covering regions where the first and second electrodes 150 and 160 are not to be formed with a photoresist, the first and second electrodes 150 and 160 may be formed by depositing a metal material having high conductivity by using an electron beam deposition method, etc.

Figure 14:
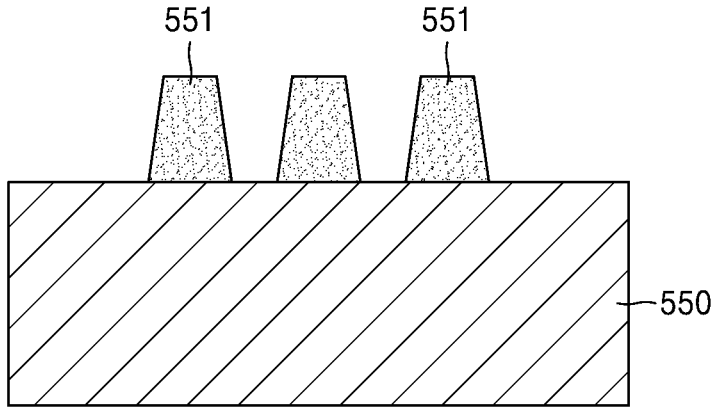
FIGS. 14 to 16 illustrate a method of forming a plurality of membranes described in the first and second manufacturing methods.

Next, a method of forming the plurality of membranes 552 described in the first and second manufacturing methods above is described with reference to FIGS. 14 to 16. Referring to FIG. 14, a plurality of sacrificial layer patterns 551 are formed on the upper surface of the substrate 550. FIG. 14 shows a case in which three sacrificial layer patterns 551 are formed on the upper surface of the substrate 550. The sacrificial layer patterns 551 may be formed in various shapes by using, for example, a photolithography method, a nanoimprint method, or an organic nanoparticle adhesion method.

Figure 15:
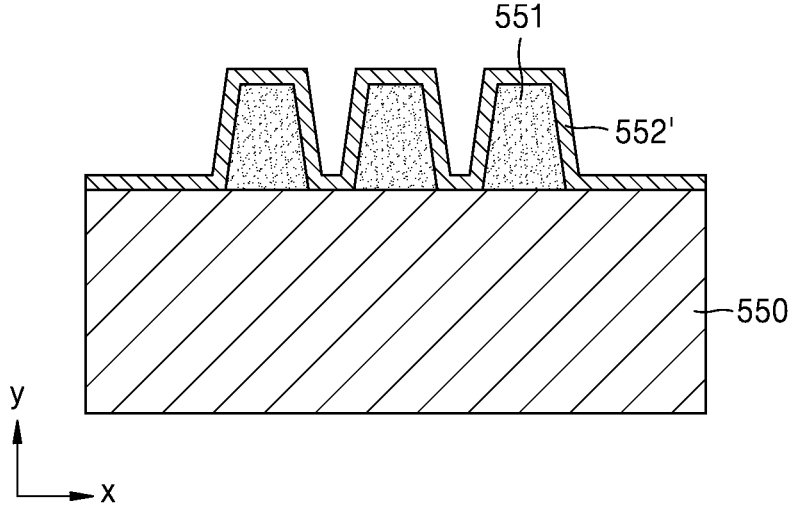

Referring to FIG. 15, a membrane material layer 552' covering the sacrificial layer patterns 551 is formed on the upper surface of the substrate 550. The membrane material layer 552' may be formed by using, for example, an ALD method, a wet synthesizing method, an oxidation process after forming a metal thin film, a sputtering method, or the like. In this case, the membrane material layer 552' may be formed in an amorphous form or a polycrystalline form of fine particles. For example, when the substrate 550 includes a sapphire substrate, the membrane material layer 552' may include alumina ($Al_2O_3$).

Figure 16:
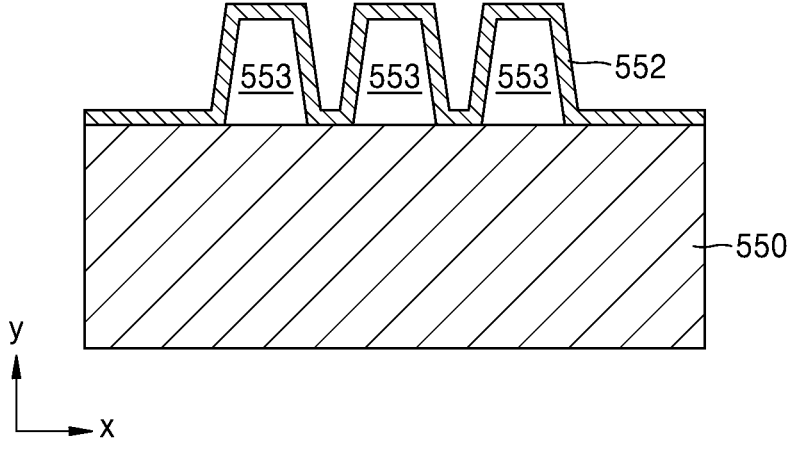

Referring to FIG. 16, the sacrificial layer patterns 551 are selectively removed from the substrate 550. In this way, when the sacrificial layer patterns 551 are removed, cavities 553 defined by the substrate 550 and the membrane material layer 552' may be formed.

After the sacrificial layer patterns 551 are removed, a plurality of membranes 552 respectively corresponding to the cavities 553 may be formed by crystallizing the membrane material layer 552' through heat treatment.

In FIG. 16, a case in which three cavities 553 and three membranes 552 are formed respectively corresponding to three sacrificial layer patterns 551 is illustrated as an example. The membranes 552 formed by the crystallization process may be formed in a polycrystalline form or a single crystal form including large particles. Leg parts of the membrane 552 may be provided on both sides of each of the cavities 553 to contact the substrate 550.

Figure 17:
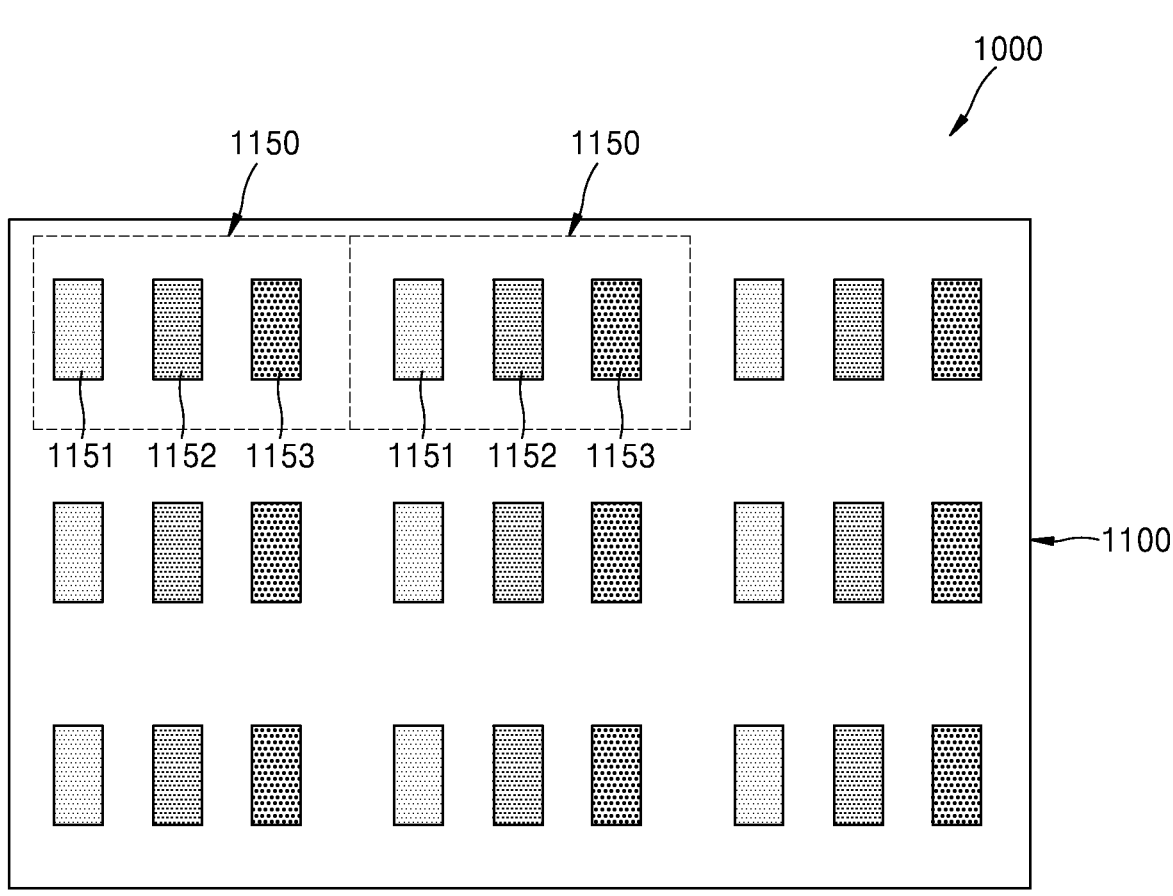
FIG. 17 is a plan view of a display apparatus including a plurality of unit pixels, according to an example embodiment.

FIG. 17 shows a display apparatus 1000 according to an embodiment. The display apparatus 1000 shown in FIG. 17 may be, for example, a micro LED display device. However, the display apparatus 1000 is not limited thereto.

Referring to FIG. 17, the display apparatus 1000 includes a plurality of unit pixels 1150. In FIG. 17, for convenience, nine unit pixels 1150 are shown. In order for the display apparatus 1000 to implement a color image, each of the plurality of unit pixels 1150 may include pixels of different colors. For example, each of the unit pixels 1150 may include first, second, and third pixels 1151, 1152, and 1153 of different colors. As a specific example, the first, second, and third pixels 1151, 1152, and 1153 may be blue, green, and red pixels, respectively. However, the display apparatus 1000 is not limited thereto.

The first, second, and third pixels 1151, 1152, and 1153 may respectively include first, second, and third LEDs emitting light of different wavelength bands. For example, when the first, second, and third pixels 1151, 1152, and 1153 are blue, green, and red pixels, respectively, the first, second, and third LEDs are red, green, and blue LEDs, respectively. In an example embodiment, the first, second, and third LEDs may each be the micro-LED 570, which is described with reference to FIGS. 8A to 8D, and respectively transferred to the positions of the first to third pixels 1151, 1152, and 1153, and thus, a detailed description thereof is omitted.

In an example embodiment, the first, second, and third pixels 1151, 1152, and 1153 may include a plurality of LEDs emitting light of the same wavelength band. For example, when the first, second, and third pixels 1151, 1152, and 1153 are blue, green, and red pixels, respectively, all of the first, second, and third pixels 1151, 1152, and 1153 may include a blue LED. In this case, the second pixel 1152 that is a green pixel may further include a green conversion layer that converts blue light into green light, and the third pixel 1153 that is a red pixel may further include a red conversion layer that converts blue light into red light.

Also, for example, when the first, second, and third pixels 1151, 1152, and 1153 are blue, green, and red pixels, respectively, all of the first, second, and third pixels 1151, 1152, and 1153 may include an ultraviolet LED. In this case, the first pixel 1151 that is a blue pixel may further include a blue conversion layer that converts ultraviolet light into blue light, the second pixel 1152 that is a green pixel may further include a green conversion layer that converts ultraviolet light into green light, and the third pixel 1153 that is a red pixel, may further include a red conversion layer that converts ultraviolet light into red light.

The display apparatus 1000 may be manufactured by forming the micro-LED by the method described above, and then, transferring the formed micro-LED to the unit pixel 1150 of a display panel 1100.

The display panel 1100 may include a controller configured to drive and control the display apparatus 1000. The controller may include a part for driving and controlling the micro-LED. The controller may be expressed as a circuit unit, a control module, or a control unit.

In the method of manufacturing a micro-LED, a sacrificial layer for separation is formed between a substrate (e.g., a nano-membrane substrate), on which the micro-LED is to be formed, and the micro-LED, and then, the micro-LED is separated from the substrate by wet etching the sacrificial layer for separation. The wet etching is a process of selectively etching only the sacrificial layer for separation, and a separation surface of the separated micro-LED is smooth enough to have a surface roughness of 2 nm or less.

In addition, in the separated micro-LED, both a P-type electrode and an N-type electrode are formed on one side, and both are formed on the opposite side to the separation surface. Accordingly, the surface on the one side on which the electrodes are formed is not smooth and has a greater surface roughness than the separation surface.

As a result, surfaces on opposite sides of the separated micro-LED have different frictional forces (coefficients of friction). Due to the frictional force difference, the separated micro-LED may be transferred by a fluid self-assembly method.

In addition, because the sacrificial layer may be completely removed from the substrate remaining after the micro-LED is separated by the selective wet etching without damaging the substrate, the substrate may be reused. Therefore, when the method of manufacturing a micro-LED according to an embodiment is used, the manufacturing cost of the micro-LED may be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. A method of manufacturing a light-emitting diode (LED) device, the method comprising:
   forming, on a substrate, a membrane formed to include a cavity;
   forming an undoped semiconductor layer on the membrane;
   forming a sacrificial layer on the undoped semiconductor layer, the sacrificial layer to be selectively removed by wet etching;
   forming a LED device on the sacrificial layer; and
   separating the LED device from the undoped semiconductor layer by the wet etching.

2. The method of claim 1, wherein the undoped semiconductor layer comprises an undoped GaN layer.

3. The method of claim 2, wherein the sacrificial layer comprises an oxide layer having the same crystal lattice structure as that of the undoped semiconductor layer.

4. The method of claim 1, further comprising forming another undoped semiconductor layer between the sacrificial layer and the LED device.

5. The method of claim 1, wherein the LED device is directly formed on the sacrificial layer.

6. The method of claim 1, wherein a plurality of membranes are formed on the substrate, and the undoped semiconductor layer is formed on the plurality of membranes.

7. The method of claim 6, wherein the forming of the undoped semiconductor layer on the plurality of membranes comprises:
   forming, on each of the plurality of membranes, first material layers to be the undoped semiconductor layer; and
   coalescing the first material layers with each other by growing the first material layers in a lateral direction.

8. The method of claim 1, wherein the sacrificial layer comprises a material having a hexagonal wurtzite lattice structure.

9. The method of claim 1, wherein HCl, $NH_4Cl$ or $H_3PO_3$ is used as an etching solution in the wet etching.

10. The method of claim 1, wherein a surface roughness of the surface separated from the sacrificial layer of the separated LED device is in a range from about 1.5 nm to about 2.5 nm.

11. The method of claim 1, wherein the sacrificial layer is formed by using a pulsed laser deposition (PLD) method, an atomic layer deposition (ALD) method, or a molecular beam epitaxy (MBE) method.

12. The method of claim 1, wherein the step of forming of the membrane formed to include a cavity on the substrate comprises:

forming a sacrificial layer pattern on the substrate;
   forming a membrane material layer covering the sacrificial layer pattern on the substrate;
   forming the cavity by removing the sacrificial layer pattern; and
   crystallizing the membrane material layer.

13. The method of claim 1, wherein the step of forming of the LED device on the sacrificial layer comprises:
   forming a first semiconductor layer on the sacrificial layer;
   forming an active layer on a partial region of one surface of the first semiconductor layer;
   forming a second semiconductor layer on the active layer; and
   forming a first electrode connected to the first semiconductor layer and a second electrode connected to the second semiconductor layer,
   wherein both of the first electrode and second electrode are formed on one side of the first semiconductor layer, which is opposite to the sacrificial layer.

14. The method of claim 1, wherein the LED device comprises a gallium nitride-based LED.

15. A method of manufacturing a display apparatus, the method comprising:
   forming a LED by using the method of claim 1; and
   transferring the formed LED to a pixel region of a display panel.

16. The method of claim 15, wherein the LED is transferred by using a fluid self-assembly method.

17. The method of claim 16, wherein the fluid self-assembly method comprises:
   stirring the formed LED with a liquid;
   dropping the liquid including the LED into grooves of a transfer substrate having a plurality of grooves formed in a surface; and
   arranging the LED dropped into the grooves.

18. A structure comprising a light-emitting device (LED), the structure comprising:
   a substrate on which a membrane formed to include a cavity is formed;
   an undoped semiconductor layer formed on the membrane;
   a sacrificial layer formed on the undoped semiconductor layer; and
   a light-emitting device layer formed on the sacrificial layer,
   wherein the light-emitting device layer comprises:
      a first semiconductor layer;
      an active layer formed on the first semiconductor layer;
      a second semiconductor layer formed on the active layer;
      a first electrode layer connected to the first semiconductor layer; and
      a second electrode layer connected to the second semiconductor layer,
   wherein both of the first electrode layer and second electrode layer are provided on one side that is opposite to the sacrificial layer.

19. The structure of claim 18, wherein the undoped semiconductor layer comprises an undoped GaN layer.

20. The structure of claim 18, wherein the light-emitting device layer comprises a gallium nitride-based LED.

* * * * *